(12) United States Patent
Yancey et al.

(10) Patent No.: US 8,604,379 B2
(45) Date of Patent: Dec. 10, 2013

(54) PLASMA SOURCE WITH INTEGRAL BLADE AND METHOD FOR REMOVING MATERIALS FROM SUBSTRATES

(75) Inventors: Peter Joseph Yancey, Sanford, NC (US); Jeffrey Kingsley, Yellow Springs, OH (US)

(73) Assignee: AP Solutions, Inc., Cary, NC (US)

( * ) Notice: Subject to any disclaimer, the term of this patent is extended or adjusted under 35 U.S.C. 154(b) by 416 days.

(21) Appl. No.: 12/702,110

(22) Filed: Feb. 8, 2010

(65) Prior Publication Data
US 2010/0219159 A1     Sep. 2, 2010

Related U.S. Application Data

(60) Provisional application No. 61/150,795, filed on Feb. 8, 2009.

(51) Int. Cl.
*B23K 10/00*     (2006.01)

(52) U.S. Cl.
USPC ............ 219/121.48; 219/121.51; 219/121.36; 15/93.1

(58) Field of Classification Search
CPC ...................................................... B23K 10/00
USPC ............. 219/121.48, 121.51, 121.58, 121.36; 15/93.1; 392/383–385
See application file for complete search history.

(56) References Cited

U.S. PATENT DOCUMENTS

| | | | |
|---|---|---|---|
| 5,313,931 A * | 5/1994 | Coulcher et al. | 126/401 |
| 5,414,324 A | 5/1995 | Roth et al. | 315/111.21 |
| 5,961,772 A * | 10/1999 | Selwyn | 156/345.39 |
| 5,970,993 A * | 10/1999 | Witherspoon et al. | 134/1.1 |
| 6,262,523 B1 | 7/2001 | Selwyn et al. | 313/231.31 |
| 6,967,304 B2 | 11/2005 | Gevelber et al. | 219/121.47 |
| 7,964,822 B2 * | 6/2011 | Suen | 219/228 |
| 2006/0000488 A1 | 1/2006 | Claar et al. | 134/1.1 |
| 2006/0052883 A1 | 3/2006 | Lee et al. | 700/28 |
| 2006/0096707 A1 | 5/2006 | Selwyn et al. | 156/345.43 |
| 2006/0156983 A1 | 7/2006 | Penelon et al. | 118/723 |
| 2006/0198944 A1 | 9/2006 | Gevelber et al. | 427/8 |
| 2007/0014752 A1 | 1/2007 | Roy et al. | 424/78.08 |
| 2007/0029500 A1 | 2/2007 | Coulombe et al. | 250/423 |

OTHER PUBLICATIONS

Kim, J.K., et al., "Adhesion characteristics of carbon/epoxy composites treated with low- and atmospheric pressure plasmas," J. Adhesion Sci. Technol. 17(13), 1751-71 (2003).

* cited by examiner

*Primary Examiner* — Mark Paschall
(74) *Attorney, Agent, or Firm* — The Eclipse Group LLP; David P. Gloekler

(57) ABSTRACT

An atmospheric pressure plasma source includes a body including a distal end, a blade extending from the distal end and terminating at a blade edge, a plasma-generating unit, and a plasma outlet communicating with the plasma-generating unit and positioned at the distal end. The plasma outlet is oriented at a downward angle generally toward the blade edge, wherein the plasma outlet provides a plasma path directed generally toward the blade edge. The plasma may be applied to the coating at an interface between the coating and an underlying substrate. While applying the plasma, the blade is moved into contact with the coating at the interface, wherein the blade assists in separating the coating from the substrate while one or more components of the coating react with energetic species of the plasma.

11 Claims, 12 Drawing Sheets

PLASMA SOURCE WITH INTEGRAL BLADE AND METHOD FOR REMOVING MATERIALS FROM SUBSTRATES

RELATED APPLICATIONS

This application claims the benefit of U.S. Provisional Patent Application Ser. No. 61/150,795, filed Feb. 8, 2009, titled "COATING REMOVAL DEVICE AND METHODS", the content of which is incorporated by reference herein in its entirety.

TECHNICAL FIELD

The present invention generally relates to the removal of materials from substrates utilizing atmospheric pressure plasma.

BACKGROUND

Atmospheric pressure (AP) plasma may be utilized to remove a coating of material (or layer, film, paint, etc.) from the surface of a substrate. The source of the AP plasma may be a device configured to discharge an AP plasma plume from a nozzle. The device may positioned at some specified distance between the nozzle and the surface of the coating, and oriented so as to direct the AP plasma plume toward the coating. While the AP plasma plume is active, the device may be moved across the coating along an appropriate path. Alternatively, other types of non-plasma chemical etchants (e.g., wet etchants) may be employed to remove the coating from a substrate. Conventionally, the plasma or other chemical etchant is utilized to attack the coating in a top-down removal process, i.e., starting with exposure to the uppermost (exposed) surface of the coating and etching/removing in the downward direction of the thickness of the coating until the underlying substrate is reached. The top-down removal process may be effective in many applications, but is hampered by the fact that all of the coating (its entire volume and thickness) must be etched in order to reach the substrate and completely remove the coating from the substrate. This may take considerable time depending on the thickness of the coating and the relative etch rate of the plasma or chemical etchant.

Another known technique for removing a coating from a substrate involves utilizing a physical scraper or blade to delaminate the coating layer from the substrate. However, physical cutting or scraping is often considered inferior to plasma- and etchant-based techniques. For instance, this technique may be ineffective if the force of the blade impinging on the coating fails to overcome the strength of the adhesive bond strength of the coating to the substrate. The coating may also flake off or shear in the bulk of the coating layer, leaving behind a partially removed coating of uneven profile. The use of intense pressure on the blade may lead to damage to the substrate and may still leave behind coating residue.

In view of the foregoing, there is a need for improved apparatus and methods for efficiently and effectively removing various types of materials from substrates without being impaired by problems attending known techniques.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, an atmospheric pressure plasma source includes a body including a distal end, a blade extending from the distal end and terminating at a blade edge, a plasma-generating unit, and a plasma outlet communicating with the plasma-generating unit and positioned at the distal end. The plasma outlet is oriented at a downward angle generally toward the blade edge, wherein the plasma outlet provides a plasma path directed generally toward the blade edge.

According to another implementation, a method is provided for removing a coating from a substrate on which the coating is disposed. A plasma is generated at atmospheric pressure. The plasma includes an energetic species reactive with one or more components of the coating. The plasma is applied as a plasma plume to the coating at an interface between the coating and the substrate. While applying the plasma, a blade is moved into contact with the coating at the interface, wherein the blade assists in separating the coating from the substrate while the one or more components of the coating react with the energetic species.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
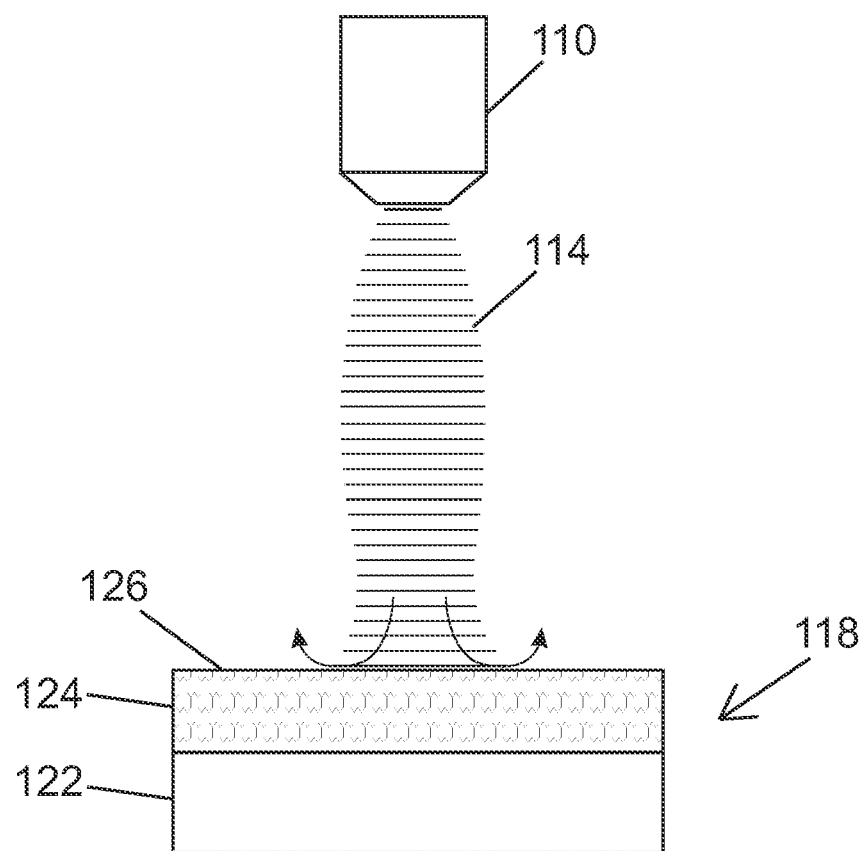
FIG. 1 illustrates an example of utilizing a conventional AP plasma source in a conventional top-down material removal technique.

As used herein, the term "plasma" generally refers to a (partially) ionized gas-like mass comprising a mixture of ions, electrons and neutral species. The term "atmospheric pressure," in the context of "atmospheric pressure plasma," is not limited to a precise value of pressure corresponding exactly to sea-level conditions. For instance, the value of "atmospheric pressure" is not limited to exactly 1 atm. Instead, "atmospheric pressure" generally encompasses ambient pressure at any geographic location and thus may encompass a range of values less than and/or greater than 1 atm as measured at sea level. Generally, an "atmospheric pressure plasma" is one that may be generated in an open or ambient environment, i.e., without needing to reside in a pressure-controlled chamber or evacuated chamber.

As used herein, a "non-thermal plasma" generally refers to a plasma exhibiting a low energy density (relative to a "thermal" plasma) and a high electron temperature relative to the temperature of the surrounding gas. A non-thermal plasma is distinguished from a thermal plasma in that a thermal plasma exhibits a high energy density and both high electron temperatures and high gas temperatures.

As used herein, the term "coating" generically refers to any material desired to be removed from an underlying substrate. The term "coating" is used interchangeably with like terms such as layer, film, paint, etc.

As used herein, the term "substrate" generically refers to any structure that includes a surface on which a coating has been applied. The substrate may present a surface having a simple planar or curved geometry or may have a complex or multi-featured topography.

For purposes of the present disclosure, it will be understood that when a layer (or coating, film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

According to some implementations disclosed herein, an AP plasma source is configured for coating removal operations, including for example the removal of polymeric coatings, paints, or the like from substrates or structures of any type. The AP plasma source is configured to exhibit exceptionally high etching rates with minimal transfer of heat to the underlying substrate. The AP plasma source generates one or more plasma plumes or jets that include one or more energetic, chemically reactive species of a type effective for removing a coating composition of interest. The AP plasma source additionally includes a blade (or scraper, etc.) that includes a blade edge constructed of a non-marring material. The plasma plumes and/or associated components utilized for plasma generation are positioned adjacent to, or embedded in, the non-marring blade. In some implementations, the AP plasma source is configured such that the blade and/or the components involved in generating or directing the plasma are easily replaceable. The non-marring blade effects physical lifting, separating and/or undercutting at the coating-substrate interface while the AP plasma chemically etches the coating at the interface and promotes rapid debonding at the interface. Accordingly, the AP plasma source effects material removal by way of a dual modality, one being the chemical (e.g., oxidizing) interaction of the activated plasma species of the plasma plume with the coating and the other being the physical interaction of the blade of the AP plasma source with the coating. As noted above, conventional plasma etching techniques must etch the full volume of the coating in order to remove the coating from the substrate. By contrast, the AP plasma sources and methods disclosed herein overcome this limitation by attacking the coating only at (and immediately proximate to) the interface. In this manner, the AP plasma source is able to greatly enhance the removal rate because the plasma etches the coating material only at the interface instead of etching the bulk of the material.

FIG. 1 illustrates an example of utilizing a conventional AP plasma source in a conventional top-down material removal technique. Specifically, FIG. 1 illustrates a nozzle 110 of the conventional AP plasma source (not shown) applying a plasma plume 114 to a typical coated structure 118. The coated structure 118 generally includes a substrate 122 and a coating or layer 124 of material desired to be removed cleanly from the substrate 122 without damaging the substrate 122. The conventional plasma plume 114 is shown interacting with a top surface 126 of the coating 124 and must interact with the entire volume of the coating 124 to remove it from the underlying substrate 122.

Figure 2:
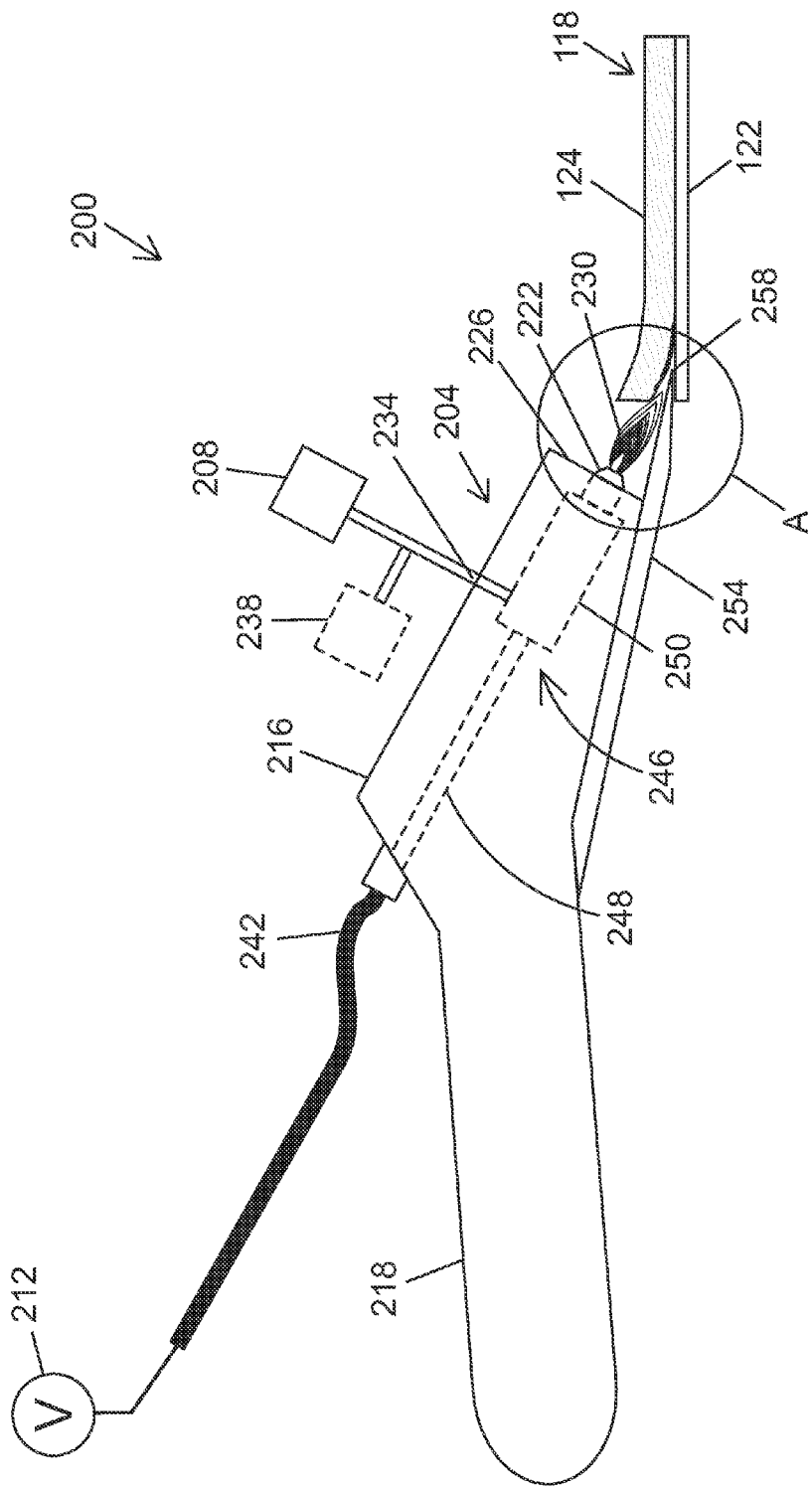
FIG. 2 is a diagram of an example of an AP plasma application system according to implementations disclosed herein.

FIG. 2 is a diagram of an example of an AP plasma application system 200 according to implementations disclosed herein. The system 200 generally includes an AP plasma source 204 (or device, applicator, apparatus, instrument, pen, gun, etc.), a plasma-generating gas supply source 208, and a power source 212. The AP plasma source 204 generally includes a main body 216 (or support structure, housing, etc.) which may be configured for manual use (i.e., handheld) or automated use (e.g., attached to a multi-axis robotics system, not shown). For manual operations, a portion of the main body 216 may be utilized as a handle 218. The AP plasma source 204 further includes a plasma outlet. In the present implementation, the plasma outlet is provided in the form of one or more nozzles 222 at or extending out from a distal end 226 of the main body 216, and from which one or more plumes or jets 230 of AP plasma are generated according to various implementations disclosed herein. The plasma-generating gas supply source 208 is in fluid communication with one or more gas inlets 234 of the AP plasma source 204 by any suitable conduit and fittings for supplying a suitable plasma-generating gas to the AP plasma source 204. In one example, the plasma-generating gas is air, in which case the plasma-generating gas supply source 208 may be a source of low-pressure compressed air. In the case of an air plasma, the plasma-generating gas supply source 208 may also serve as the source of active species of the AP plasma (e.g., oxygen- and nitrogen-based species). Alternatively, one or more reactive gas supply sources 238 may also be placed in communication with the AP plasma source 204 for such purposes as enhancing the supply of $O_2$ or $N_2$ or for supplying other types of reactive species (e.g., He, Ar, other noble gases, halogens, $NH_3$, $CO_2$, various hydrocarbons, etc.).

The power source 212 is in electrical communication with the AP plasma source 204 by any suitable conduit 242 (e.g., wiring) and connectors for supplying electrical power according to operating parameters suitable for generating and maintaining a stable AP plasma. In some embodiments, the conduit 242 represents a single conduit that encloses both the electrical wiring and the gas feed conduit(s) from the gas source(s) 208, 238. In FIG. 2, the power source 212 represents the electronics and user controls needed for this purpose. As appreciated by persons skilled in the art, the user controls may be configured as necessary to enable the setting and adjustment of various operating parameters of the voltage or current signal fed to the AP plasma source such as, for example, power level, drive voltage amplitude, drive frequency, waveform shape, etc. Electrical signals of AC (e.g., RF), DC, pulsed DC, or arbitrary periodic waveforms with or without a DC offset may be utilized to drive the AP plasma as appropriate for a particular application. Generally, the AP plasma source 204 may include any internal components suitable for generating a stable AP plasma that is subsequently discharged from the nozzle. In the present example, the AP plasma source 204 is diagrammatically shown as including a plasma-generating unit or module 246 in the main body 216. The plasma-generating unit 246 may include a powered or "hot" electrode 248 extending into a plasma-generating chamber 250 in fluid communication with the gas inlets 234. The plasma-generating chamber 250 serves as a ground electrode for generating plasma and as a conduit for containing and flowing gases and plasma. In operation, the plasma is generated in an electric and/or magnetic field established between the hot electrode 248 and the chamber 250 and subsequently flows with the gas flow toward the nozzle 222. If the AP plasma source 204 includes more than one nozzle 222, each nozzle 222 may include its own plasma generating unit 250.

As further illustrated in FIG. 2, the AP plasma source 204 includes a scraper or blade 254 extending out from the distal end 226 of the main body 216 below the nozzle 222 and the plasma plume 230. The thickness of the blade 254 tapers down to a distal blade edge 258 (i.e., the leading edge of the blade 254). In some implementations, the blade 254 is adjoined to the main body 216 so as to be easily attachable to and detachable from the main body 216, for cleaning, replacement, etc. For example, the blade 254 may be attached to the main body 216 by suitable fasteners (not shown). In the illustrated example, the blade 254 extends out from the main body 216 farther than the nozzle 222. The blade 254 may extend out to a distance somewhat greater than the expected length of the plasma plume 230, or alternately may be shorter than or terminate at about the same point or line as the end region of the plasma plume 230. Also in this example, the nozzle 222 is oriented at an acute angle relative to the blade 254 such that plasma plume 230 is directed toward the blade edge 258, whereby the blade edge 258 and the distal-most region of the plasma plume 230 are both focused at the same point or line in front of the AP plasma source 204. The distal-most region of the plasma plume 230 is also referred to herein as the "plasma front."

The blade 254 may be fabricated from a material that will not scratch, mar or otherwise damage the material of the substrate of the coated structure to which the plasma plume 230 and blade 254 are applied. The particular material selected for the blade 254 may depend on the type of substrate contemplated. As examples, an aluminum blade may be utilized on a substrate made of steel or other material significantly harder than aluminum. A steel blade may be utilized on a glass or hard stone substrates. A magnesium or beryllium blade may be utilized on an aluminum substrate. In other applications, the blade 254 may be composed of a composite material that may include fiberglass, carbon fiber, or other suitable composite. Aramids, polyamides, polyimides and other high-temperature plastics may be utilized. Machinable ceramics such as Mykroy® or Macor® may be utilized. Another example is silicone-impregnated fiber composites. Yet another example is Ryton®, which is a highly loaded, high-temperature, injection-moldable polyphenylene sulfide plastic. Vespel® may also be utilized. Vespel® and Ryton® are examples of polymers exhibiting good resistance to plasma.

Figure 3:
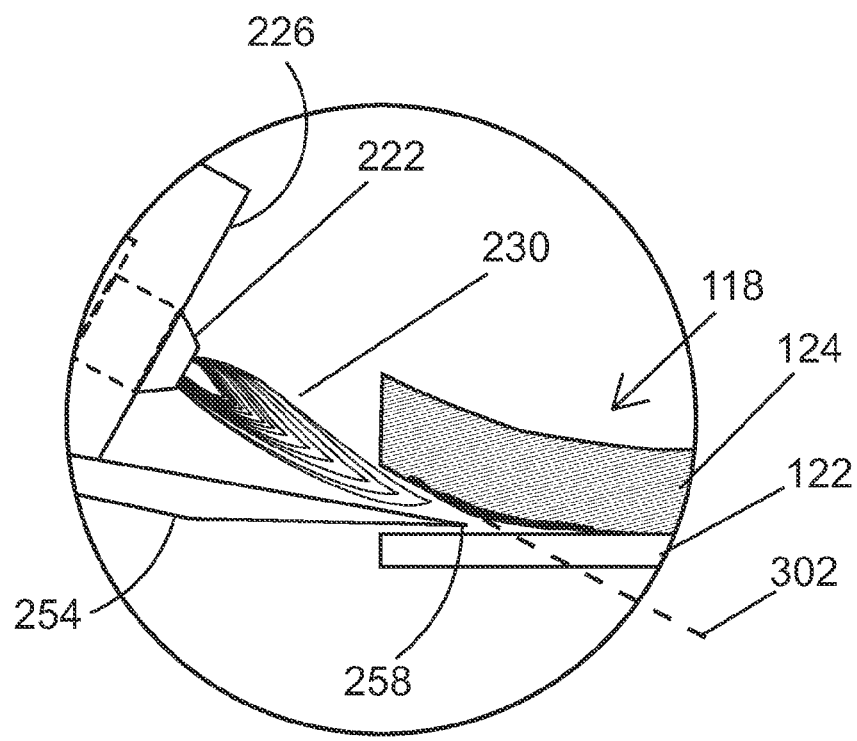
FIG. 3 is a detailed view of the region designated "A" in FIG. 2 surrounding the coating-substrate interface.

FIG. 2 further illustrates an example of applying the AP plasma source 204 to a coated structure 118. FIG. 3 is a detailed view of the region designated "A" in FIG. 2 surrounding the coating-substrate interface. No specific limitations are placed on the type of coated structure 118 to which the AP plasma source 204 is applicable. Generally, the coated structure 118 includes a substrate 122 and a coating 124 disposed in any fixed manner (e.g., adhered, baked, cured, bound, painted, etc.) on the underlying substrate 112. The substrate 122 may have any composition, e.g., metallic, polymeric, ceramic, etc. Moreover, generally no limitation is placed on the type or composition of the coating 124 to be removed. The coating 124 will generally be one in which at least some of the components are responsive to active species of the AP plasma. Such coatings 124 may include, for example, various types of polymeric coatings and paints. Generally, no limitation is placed on the thickness of either the substrate 122 or the coating 124. Moreover, the substrate 122 and associated coating 124 are not required to have a simple planar or curvilinear geometry. Instead, the AP plasma source 204 is effective for treating three-dimensional topographies, irregular profiles, and complex geometries. The AP plasma source 204 may be utilized to apply the plasma plume 230 around structural features such as, for example, rivets, or inside narrow channels, or in corners or cracks, etc.

It will also be understood that a "material," "coating," "layer," "film" or the like as used herein encompasses single-layer, multi-layered or composite materials. For instance, a given polymeric material may include a protective overcoat, an adhesion-promoting layer, or the like. A paint may include a primer layer, a topcoat, etc. The AP plasma source 204 is effective for all such layers or strata of a multi-layered material down to the underlying substrate 122. The AP plasma source 204 may also be utilized to precisely remove one or more selected layers of a multi-layered material, leaving underlying layers intact on the substrate 122.

In operation, the AP plasma source 204 is moved toward the coated structure 118 (or, equivalently, the coated structure 118 is moved toward the AP plasma source 204) such that the blade 254 and plasma plume 230 encounter the interface (or bond line) between the substrate 122 and the coating 124. It will be noted that in many situations, an interface is not initially exposed, in which case the AP plasma source 204 may first be operated to etch down through the coated structure until the interface is exposed. In the illustrated example in which the blade 254 extends out from the main body 216 of the AP plasma source 204 at a greater distance than the plasma plume 230, the blade edge 258 may encounter the interface first. However, as noted above the plasma outlet (in the present implementation, the nozzle 222) of the AP plasma source 204 may be oriented so as to provide a plasma path in a plasma flow direction 302 directed generally toward the blade edge 258. That is, the plasma outlet is oriented such that the plasma plume 230 is focused generally toward the blade edge 258 and thus preferentially directed at the interface along with the blade edge 258. This configuration is advantageous because the volume of the coating 124 being etched per unit area of removed coating 124 is much greater compared to a conventional top down etching process. The energetic species of the plasma plume 230 etch away the coating 124 at the interface (preferably without damaging the substrate 122) according to any mechanism or reaction dependent on the energetic species and the material being etched. For instance, oxygen-based species may react with polymeric components of the coating 124 to synthesize carbon dioxide and/or water vapor. While the plasma plume 230 etches the coating 124, the blade 254 is moved into the coated structure 118 at the interface so as to assist in separating and lifting the coating 124 from the underlying substrate 122. It thus can be seen that the entire thickness of the coating 124 may be removed from the substrate 122 without requiring that the entire volume of the coating 124 be subjected to the plasma plume 230 as in conventional techniques. That is, only a fraction of the coating 124, at the interface with the substrate 122, needs to actually interact with the plasma plume 230.

The plasma generated by the AP plasma source 204 may be a cold, or non-thermal, plasma containing one or more reactive species suitable for chemically interacting with the coating 124 in a manner sufficient for causing the coating 124 to be removed from its underlying substrate 122. Generally, the reactive species may include photons, metastable species, atomic species, free radicals, molecular fragments, monomers, electrons, and ions. The reactive species desired to be produced will generally depend on the type of coating 124 to be removed. In the case of various polymeric coatings and paints, a highly oxidizing plasma has been found to be effective, in which case the predominant reactive species may include O, $O_2^*$ (the asterisk designating the metastable form of diatomic oxygen), and/or $O_3$. In various implementations, air supplied by the plasma-generating gas supply source 208 may be sufficient for generating an effective amount of oxygen-based energetic species for removing various types of polymeric coatings or paints. Additional non-limiting examples of active species that may be formed in the plasma and utilized for material removal include fluorine, chlorine, bromine, iodine, nitrogen, or sulphur. One or more of these species may be utilized, for example, to selectively etch (or enhance the etching selectivity of) a primer layer or adhesion layer whether or not a specialized chemistry or primer formulation has been employed in the coated structure. For example, in the case of a primer that exhibits preferential etching by oxygen, oxygen species could be used so that the primer layer is preferentially etched relative to a topcoating layer. The oxidizer may also be mixed with an inert gas or relatively inert gas such as nitrogen or natural air mixtures. It is also possible to use reducing plasma species such as hydrogen or ammonia. It is also possible to use neutral or inert gases to energetically bombard the interface layer and promote decohesion at the bond line. The type of oxidizing species in the plasma plume 230 may be adjusted for specific coating chemistries to maximize the etch rate of the coating 124. For instance, certain coating chemistries may be quite resistant to an oxygen-containing oxidizer but could be quite easily etched by a fluorinated oxidizer.

As an example demonstrating the effectiveness of the present teachings, consider a coated structure comprising a coating that is 0.125 inch thick over a 12-inch by 12-inch panel (area=144 $in^2$). If a conventional, top-down process is employed to remove this coating, then the volume of material that must be etched is 12-inch×12-inch×0.125-inch=18 $in^3$. By contrast, the AP plasma source 204 disclosed herein would attack and etch this coating only at its interface with the underlying panel, and would likely need to etch only 0.005 inch of the coating thickness at the interface, which would equate to 12-inch×12-inch×0.005-inch=0.72 $in^3$ of material etched. Assuming the volumetric etch rate of the AP plasma source 204 remains constant throughout the coating removal process, then etching the same 144 $in^2$ area would require only 1/24th of the time to completely remove the coating as compared to the conventional top-down technique.

Generally, operating parameters associated with the AP plasma source 204 are selected so as to produce a stable plasma discharge. The operating parameters will depend on the particular application, which may range, for example, from nanoscale etching of micro-fabricated structures or devices (e.g., MEMS devices) to removing large areas of paint from aircraft carriers. Examples of operating parameters will now be provided with the understanding that the broad teachings herein are not limited by such examples. Generally gas feed rates and pressures will depend on the type of source gases employed. In the case of generating an air plasma, the rate at which the air is fed to the AP plasma source 204 may range from $1 \times 10^{-6}$ SCCM to $1 \times 10^6$ SCCM. The feed pressure into the AP plasma source 204 may range from 1 Pa to $1 \times 10^7$ Pa. The power level of the electrical field driving the plasma may range from $1 \times 10^{-6}$ W to $1 \times 10^6$ W. The drive frequency of the electrical field may range from DC (0 GHz) to 100 GHz. The foregoing parameters may depend on the composition and thickness of the material to be removed as well as the intended scale (nanoscale vs. macroscale) on which the removal process is planned to be performed.

Figure 4:
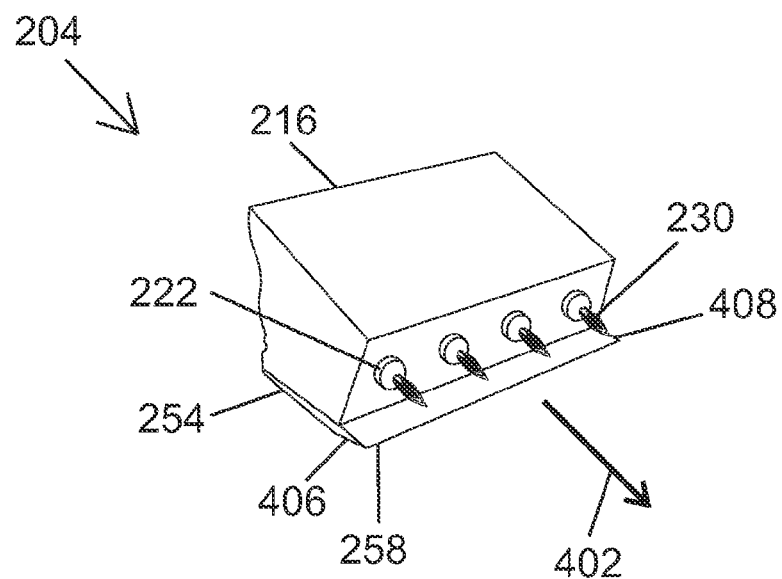
FIG. 4 is a front perspective view of the front portion of the example of the AP plasma source illustrated in FIG. 2.

FIG. 4 is a front perspective view of the front portion of the example of the AP plasma source 204 illustrated in FIG. 2. In this example, the AP plasma source 204 includes a plurality of nozzles 222 arranged in a linear series along the width of the main body 216, spaced apart from each other and positioned above the blade 254. Accordingly, the AP plasma source 204 emits a corresponding number of plasma plumes 230. Each nozzle 222 may communicate with a respective plasma-generating unit 246 (i.e., electrode 248 and plasma-forming chamber 250) housed in the main body 216. As also shown in FIG. 4, the plasma plume or plumes 230 flow along a plasma path 402 in a direction generally toward the blade edge 258. By "generally" is meant that the plasma path 402 is not required to exactly intersect the blade edge 258. The angle of the plasma path 402 may be such that the plasma path 402 encounters the blade 254 at a point or line short of the blade edge 258, or passes the plane of the blade 254 at a point or line beyond the blade edge 258. As further shown in FIG. 4, the blade 254 or at least the blade edge 258 has a blade width in a direction transverse to the direction in which the plasma path 402 runs (i.e., the flow direction of the plasma path 402). The blade width may be defined as extending between opposing lateral sides 406, 408 of the blade 254. The plasma plume 230 established by the plasma outlet—or in the present implementation the collection of plasma plumes 230 established by the linear series of nozzles 222, which collectively form a plasma front—likewise has a width in the transverse direction. The plasma outlet (e.g., the nozzles 222) may be configured such that the width of the resulting plasma plume 230 is coextensive with (or spans) a substantial portion of the width of the blade edge 258.

Figure 5:
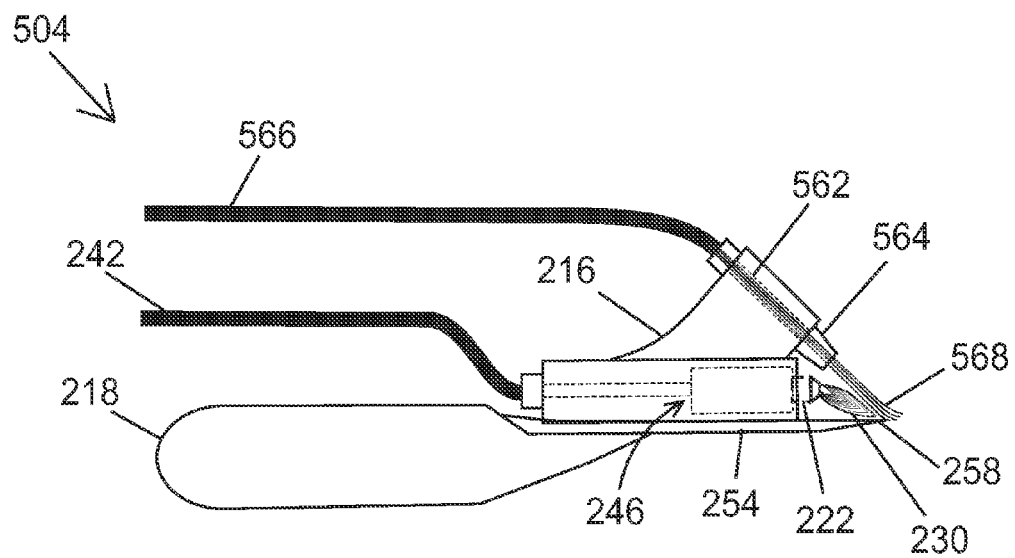
FIG. 5 is a side elevation view of an example of an AP plasma source according to another implementation.
Figure 6:
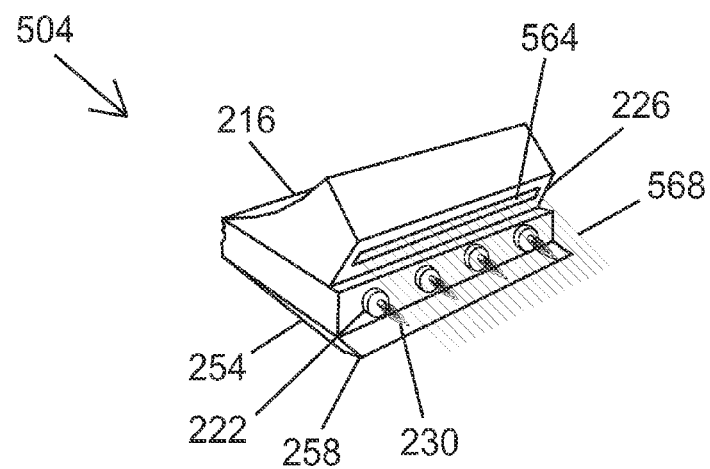
FIG. 6 is a front perspective view of the front portion of the AP plasma source illustrated in FIG. 5.

FIG. 5 is a side elevation view of an example of an AP plasma source 504 according to another implementation. FIG. 6 is a front perspective view of the front portion of the AP plasma source 504 illustrated in FIG. 5. In this example, the main body 216 includes a plenum 562 (or manifold, chamber, etc.) communicating with a gas outlet 564 located at the distal end 226 above the nozzles 222. A dedicated gas line 566 may communicate with the plenum 562 to supply air or other inert gas. Alternatively, the AP plasma source 504 may be configured to route a portion of the plasma-generating gas fed through the gas line utilized to supply the plasma-generating unit 246 to the plenum 562. As illustrated, the cross-sectional flow area of the gas outlet 564 may have an aspect ratio in which the width (transverse to the direction of flow) is the dominant dimension. That is, the gas outlet 564 in this example is shaped as a slot. By this configuration, the gas stream is emitted from the gas outlet 564 as a gas curtain or air knife 568. As with the nozzles 222, the main body 216 may be configured such that the gas outlet 564, and thus the gas curtain 568, are angled toward the blade edge 258 such that the resulting gas path is directed generally toward the blade edge 258. The gas curtain 568 may be utilized to affect the shape of the output of the linear plasma plumes 230, thereby focusing the plasma into a narrow stream that may increase the removal rate of coating material at the coating/substrate interface of a coated structure. This auxiliary gas supply may also assist in cooling the substrate during application of the plasma.

Figure 7:
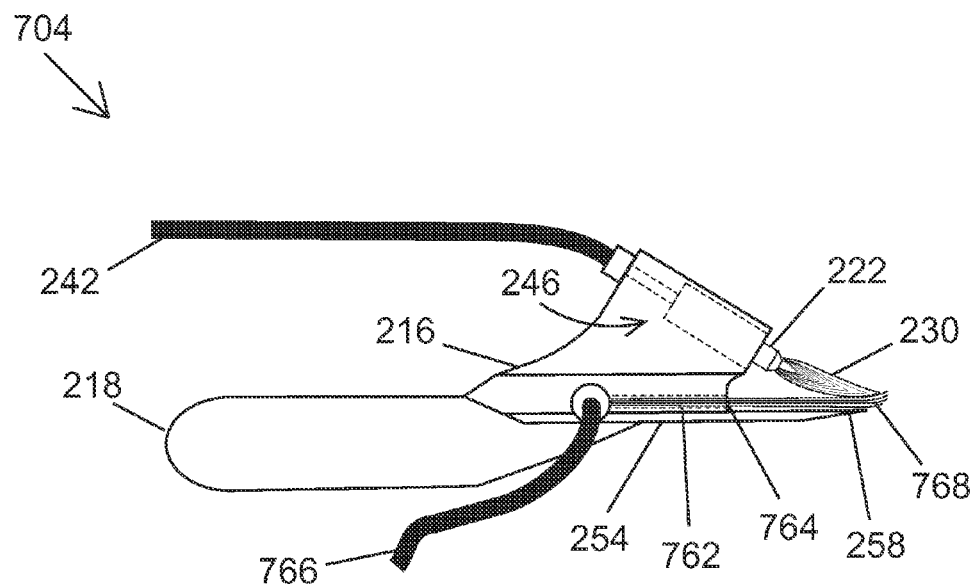
FIG. 7 is a side elevation view of an example of an AP plasma source according to another implementation.
Figure 8:
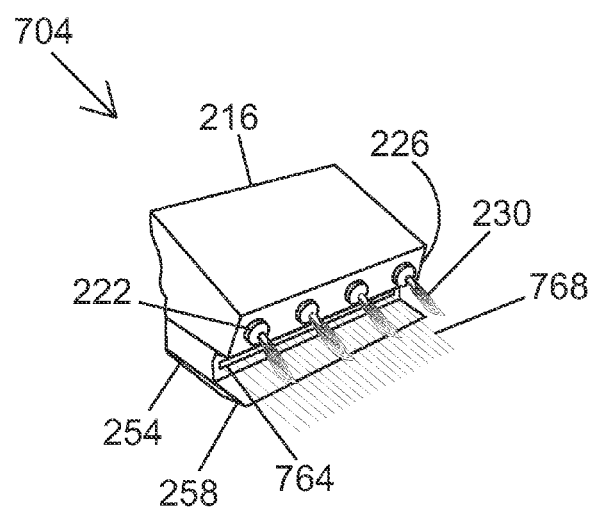
FIG. 8 is a front perspective view of the front portion of the AP plasma source illustrated in FIG. 7.

FIG. 7 is a side elevation view of an example of an AP plasma source 704 according to another implementation. FIG. 8 is a front perspective view of the front portion of the AP plasma source 704 illustrated in FIG. 7. In this example, the main body 216 includes a plenum 762 communicating with a gas outlet 764 located at the distal end 226 below the nozzles 222 and above the blade 254. A dedicated gas line 766 may be connected to the plenum 762 to supply air or other inert gas. Alternatively, a portion of the plasma-generating gas may be routed to the plenum 762 for this purpose, as described above. The gas outlet 764 may be shaped as a slot. By this configuration, the gas stream is emitted from the gas outlet 764 as a gas curtain or air knife 768 below the plasma. The gas outlet 764 may be oriented such that the gas curtain 768 flows generally parallel to the blade 254, or alternatively the gas curtain 768 may be angled relative to the blade 254. The gas curtain 768 may be utilized for the same purposes as described above in conjunction with FIGS. 5 and 6.

Figure 9:
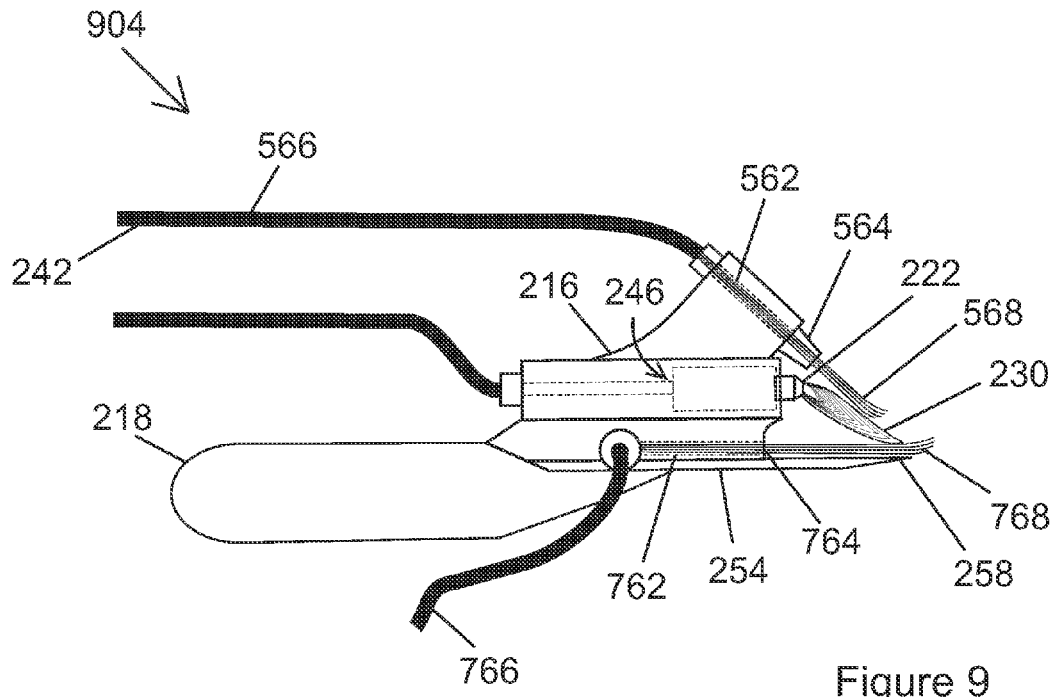
FIG. 9 is a side elevation view of an example of an AP plasma source according to another implementation.
Figure 10:
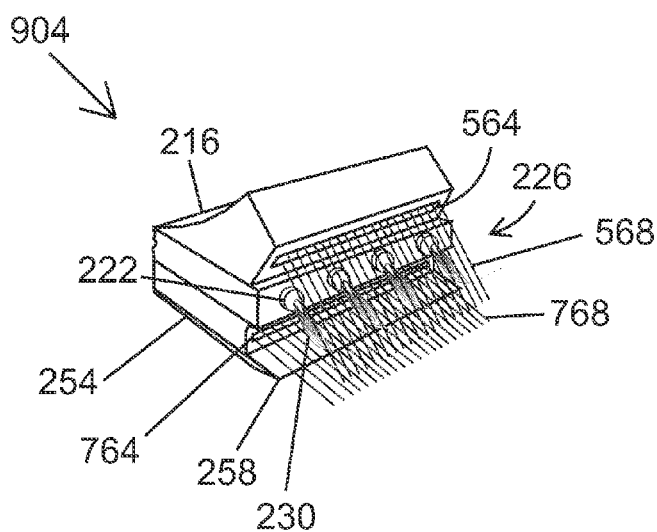
FIG. 10 is a front perspective view of the front portion of the AP plasma source illustrated in FIG. 9.

FIG. 9 is a side elevation view of an example of an AP plasma source 904 according to another implementation. FIG. 10 is a front perspective view of the front portion of the AP plasma source 904 illustrated in FIG. 9. In this example, the main body 216 includes an upper plenum 562 communicating with an upper gas outlet 564 located at the distal end 226 above the nozzles 222, and a corresponding gas line 566, similar to the implementation illustrated in FIGS. 5 and 6. The main body 216 also includes a lower plenum 762 communicating with a lower gas outlet 764 located at the distal end 226 below the nozzles 222 but above the blade 254, and a corresponding gas line 766, similar to the implementation illustrated in FIGS. 7 and 8. Consequently, the plasma plumes 230 flow between an upper (or first) gas curtain 568 and a lower (or second) gas curtain 768. The gas curtains 568, 768 may be utilized for the same purposes as described above in conjunction with FIGS. 5-8.

Figure 11:
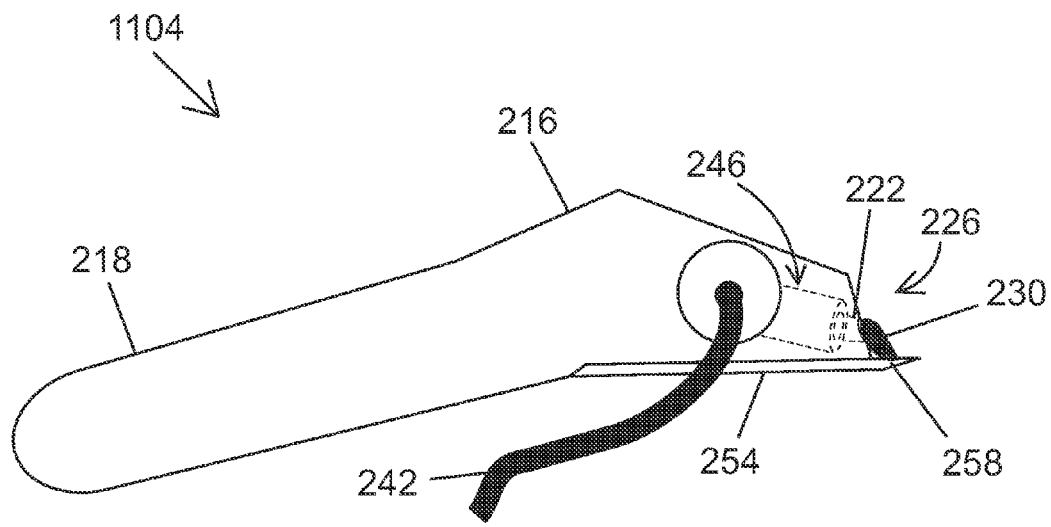
FIG. 11 is a side elevation view of an example of an AP plasma source according to another implementation.
Figure 12:
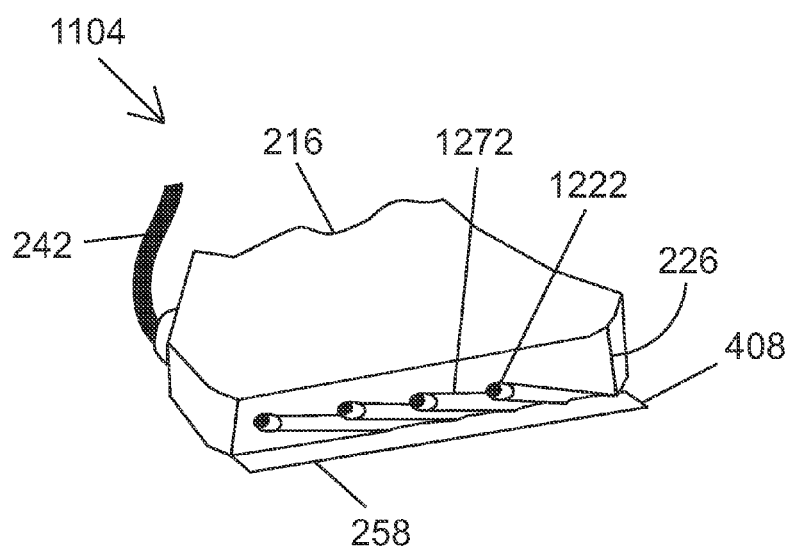
FIG. 12 is a front perspective view of the front portion of the AP plasma source illustrated in FIG. 11.
Figure 13:
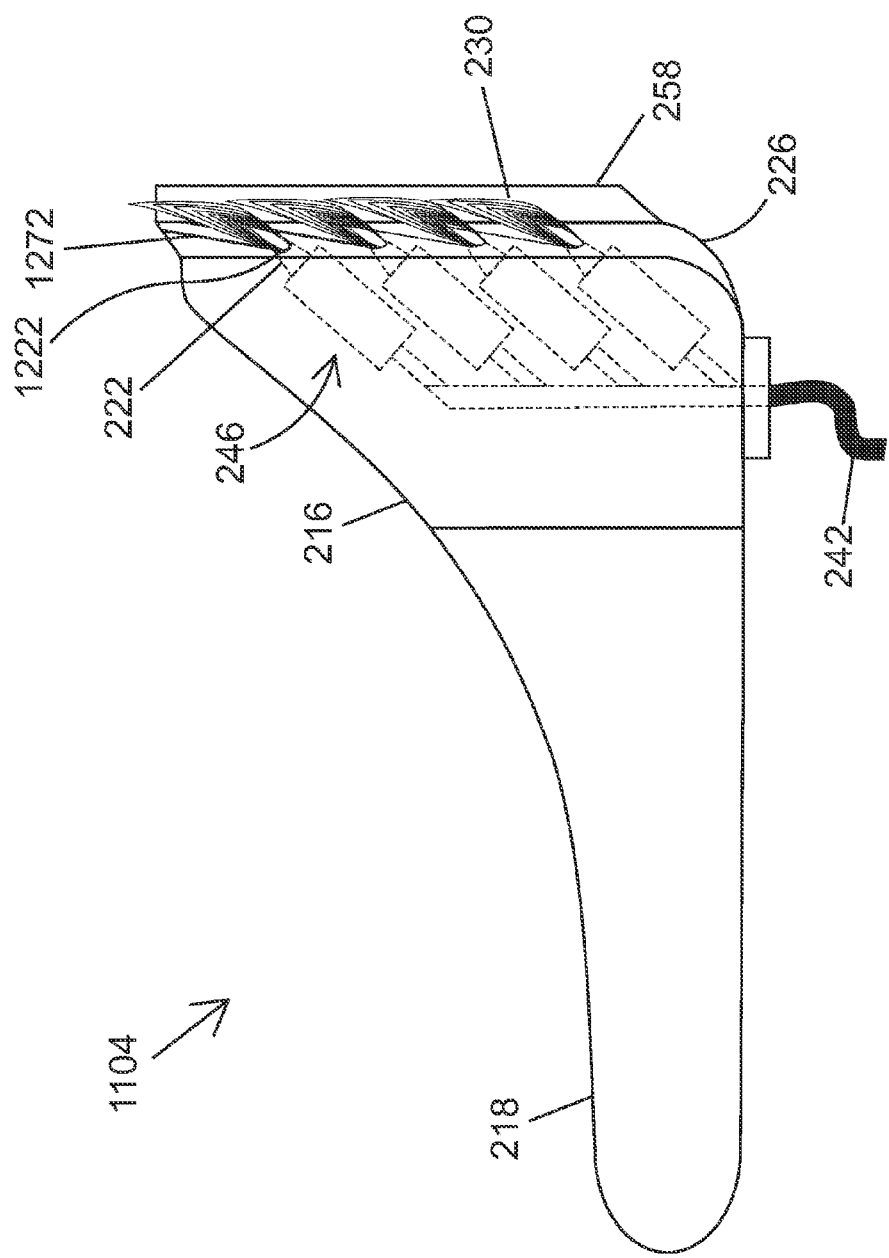
FIG. 13 is a plan view, in partial cross-section, of the AP plasma source illustrated in FIGS. 11 and 12.

FIG. 11 is a side elevation view of an example of an AP plasma source 1104 according to another implementation. FIG. 12 is a front perspective view of the front portion of the AP plasma source 1104 illustrated in FIG. 11. FIG. 13 is a plan view of the AP plasma source 1104 illustrated in FIGS. 11 and 12. In this example, the nozzles 222 are embedded further into the main body 216 and communicate with respective angled plasma outlets 1222 (e.g., orifices) located at the distal end 226. The plasma outlets 1222 are angled, not only downward relative to the blade 254 but also laterally relative to the direction of blade movement (i.e., toward a coated structure). Stated in another way, one component of the angle may be considered as being toward a lateral side 408 of the blade 254. FIG. 13 illustrates the orientation of the plasma plumes 230 that results from this configuration. It can be seen that a part of the "lengths" of the plasma plumes 230 are now more closely projected on the plasma front that initially comes into contact with the coating-substrate interface, and the plasma front is more contiguous as a plasma line rather individual plasma jets. This configuration may be useful for enhancing the focus of the plasma toward the blade 254 and the coating/substrate interface and for providing for uniform coverage by the plasma across the interface. The angled direction of the plasma plumes 230 may be enhanced or accommodated by providing angled grooves 1272 leading from the angled plasma outlets 1222.

Figure 14:
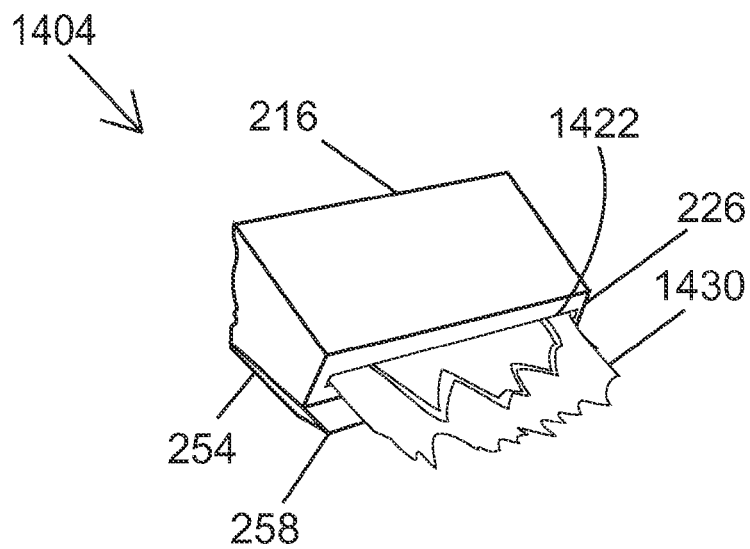
FIG. 14 is a front perspective view of the front portion of an AP plasma source according to another implementation.

FIG. 14 is a front perspective view of the front portion of an AP plasma source 1404 according to another implementation. The AP plasma source 1404 includes a plurality of plasma-generating units 246 as described above. In this implementation, a plenum in the main body 216 interconnects the plasma-generating units 246 with a slot-shaped plasma outlet 1422. By this configuration, the respective plasma plumes emitted from the plasma-generating units 246 combine (or merge, coalesce, etc.) to form a "plasma line" 1430, i.e., a continuous, focused line of plasma directed at the coating/substrate interface. Optionally, one or more of the plasma-generating units 246 or outlets thereof may be angled toward the others to enhance the combination of the plasma plumes into the single plasma line 1430.

Figure 15:
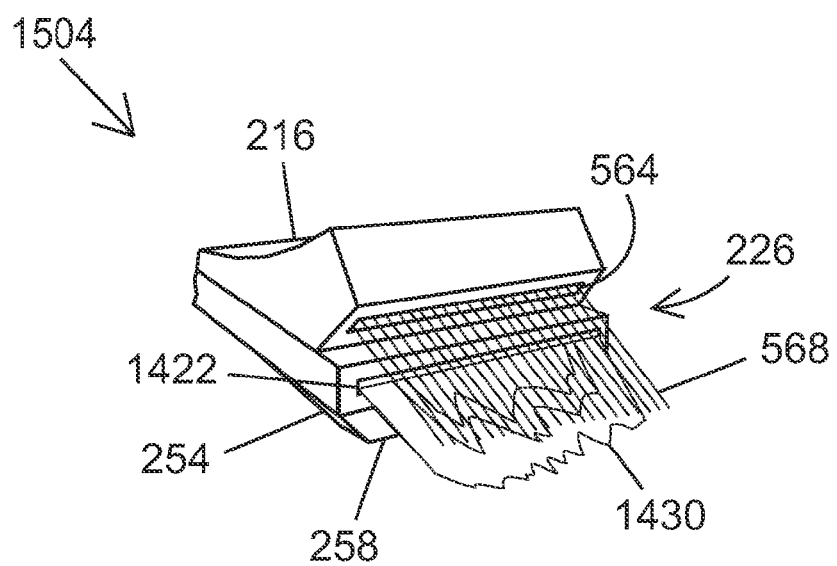
FIG. 15 is a front perspective view of the front portion of an AP plasma source according to another implementation.

FIG. 15 is a front perspective view of the front portion of an AP plasma source 1504 according to another implementation. The AP plasma source 1504 is configured to emit a plasma line 1430 as just described in conjunction with FIG. 14. In addition, the AP plasma source 1504 is configured to emit an upper gas curtain 568 as described above in conjunction with FIGS. 5 and 6. Alternatively, the AP plasma source 1504 may be configured to emit a lower gas curtain 768 as described above in conjunction with FIGS. 7 and 8.

Figure 16:
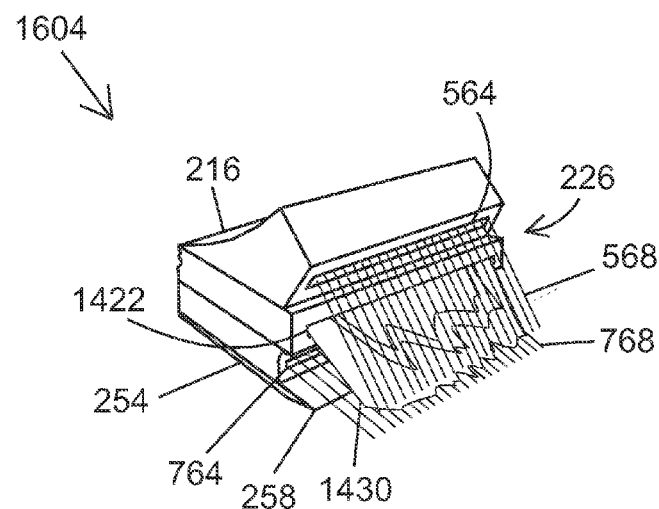
FIG. 16 is a front perspective view of the front portion of an AP plasma source according to another implementation.

FIG. 16 is a front perspective view of the front portion of an AP plasma source 1604 according to another implementation. The AP plasma source 1604 is configured to emit a plasma line 1430 as just described in conjunction with FIG. 14. In addition, the AP plasma source 1604 is configured to emit an upper gas curtain 568 and a lower gas curtain 768 as described above in conjunction with FIGS. 9 and 10.

Figure 17:
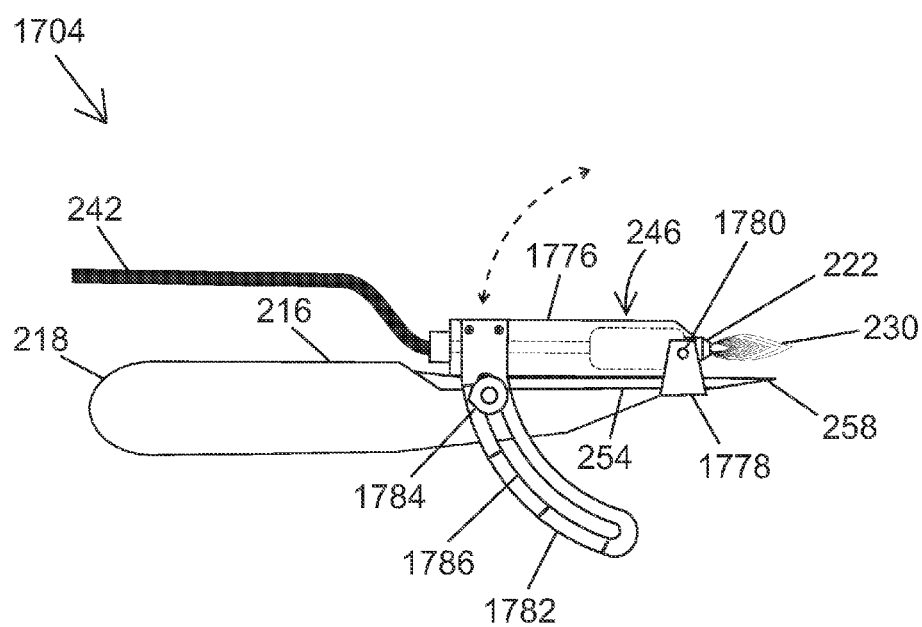
FIG. 17 is a side elevation view of an example of an AP plasma source according to another implementation.

FIG. 17 is a side elevation view of an example of an AP plasma source 1704 according to another implementation. The AP plasma source 1704 is configured to enable adjustment of the angle of the plasma plume 230 relative to the blade 254. For example, a portion 1776 of the AP plasma source 1704 that includes the nozzles 222 may be pivotable about a transverse axis provided by a structural member such as a yoke 1778 supporting one or more pins 1780. The AP plasma source 1704 may include a mechanism for locking the pivotable portion 1776 in place at a selected angle. As one example, the AP plasma source 1704 may include a bracket 1782 that moves with the pivotable portion 1776. A suitable fastener 1784 extends through a curved slot 1786 of the bracket 1782 and into the main body 216. The fastener 1784 may be manipulated to bear against the bracket 1782 to prevent its movement, thereby locking the position of the pivotable portion 1776 and fixing the angle of the plasma plume 230. This adjustable configuration may be useful for different coating removal conditions, such as varying coating thicknesses, curved surface topologies, etc.

In another implementation, a portion of the AP plasma apparatus such as its distal end region may be flexible or compliant. This may be useful for enabling the AP plasma apparatus to bend around or conform to curved or complex surfaces.

Figure 18:
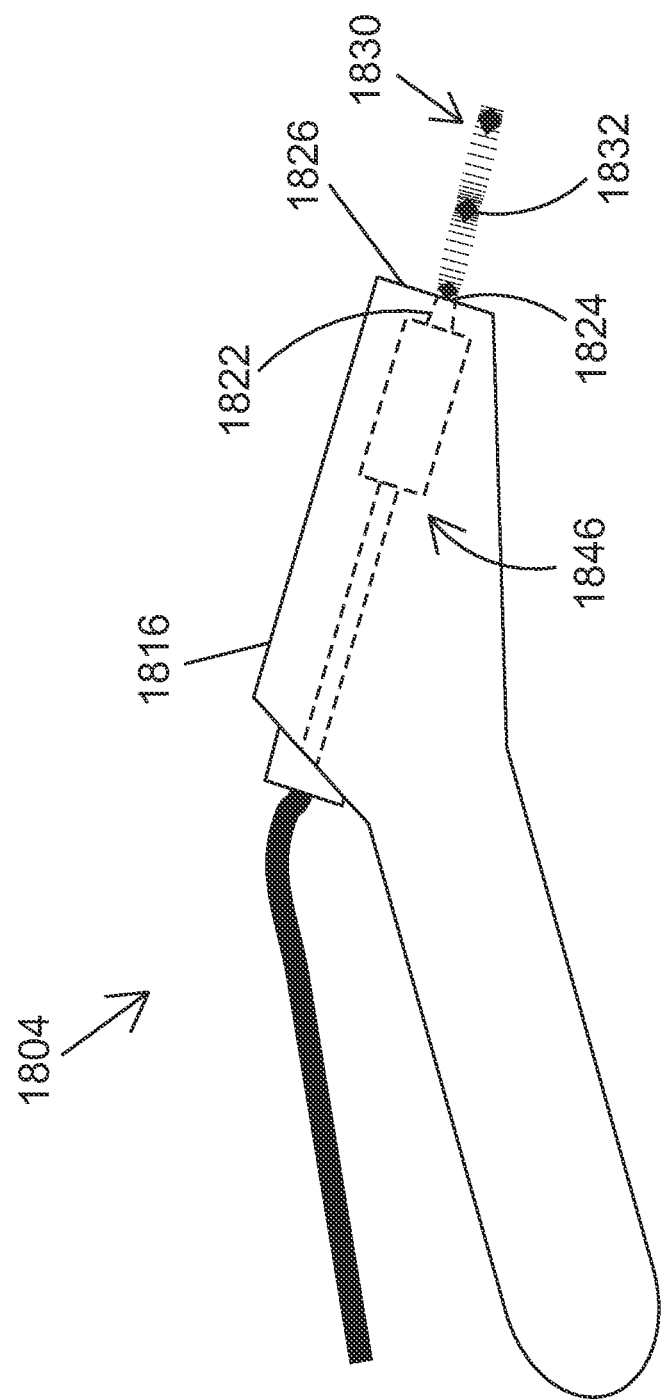
FIG. 18 is a side elevation view of another example of an AP plasma source according to another implementation.
Figure 19:
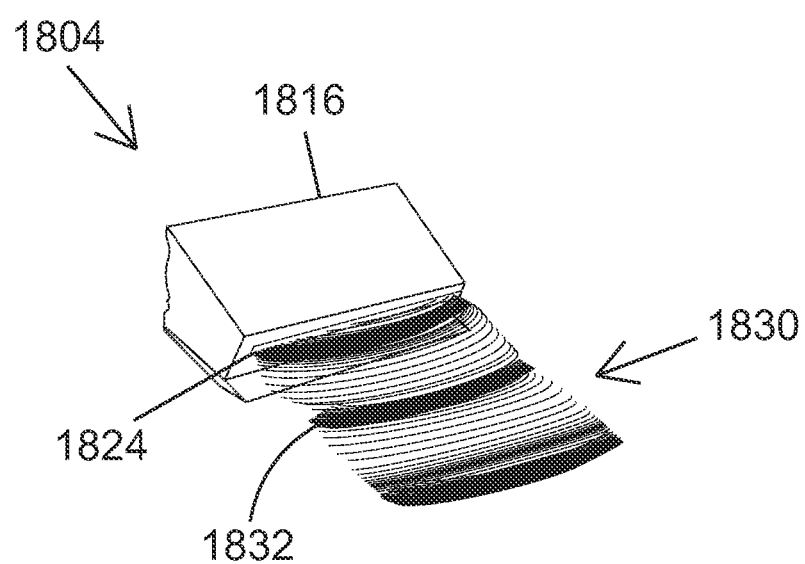
FIG. 19 is a front perspective view of the front portion of the AP plasma source illustrated in FIG. 18.

FIG. 18 is a side elevation view of another example of an AP plasma source 1804 according to another implementation. FIG. 19 is a front perspective view of the front portion of the AP plasma source 1804 illustrated in FIG. 18. The AP plasma source 1804 includes one or more plasma-generating units 1846 in a main body 1816 communicating with one or more nozzles (or a manifold) 1822. The nozzle(s) or manifold 1822 are set back in the main body 1816 and communicate with a slot-shaped plasma outlet 1824 that opens at a distal end 1826 of the main body 1316. By this configuration, the AP plasma source 1304 produces a wide, predominantly linear or horizontally-oriented plasma plume or "plasma line" 1830 with wide, predominantly linear or horizontally-oriented shock waves or pressure waves 1832.

The generation of shock waves or pressure waves 1832 is described in detail in a copending U.S. patent application Ser. No. 12/702,039, filed Feb. 8, 2010, titled "PLASMA SOURCE AND METHOD FOR REMOVING MATERIALS FROM SUBSTRATES UTILIZING PRESSURE WAVES", the content of which is incorporated by reference herein in its entirety. Briefly, the pressure-wave or shock-wave assisted plasma plume exhibits areas of periodically increasing (high) and decreasing (low) plasma density. Without wishing to be bound by any one particular theory, it is postulated herein that this periodic plasma density contributes to enhanced removal rates, and that the plasma plume may be characterized as exhibiting pressure waves or pressure fronts, which in some implementations may be further characterized as shock waves or shock fronts that may be observed as supersonic shock diamonds or Mach disks. When the AP plasma source is operated to apply the plasma plume to a material to be removed, the shock waves (or other type of pressure waves) generated in the plasma plume physically disrupt the loosely adhered build-up on the material. The as-generated shock wave or pressure wave interacts with the loosely adhered residue and the residue is consequently ejected from or blown off the surface. Accordingly, the AP plasma source in this case effects material removal by way of another dual modality, one being the chemical (e.g., oxidizing) interaction of the activated plasma species of the plasma plume with the coating and the other being the physical interaction of the shock wave or pressure wave structures of the plasma plume with the coating. The AP plasma source according to this implementation overcomes the limitations of conventional techniques by enabling inorganic or other typically unresponsive components to be rapidly broken up or peeled away, thereby continuously revealing fresh new surfaces of the coating for treatment by the activated species of the plasma.

Certain pressure regimes, geometrical configurations, and other operational parameters will give rise to suitable plasma and shock wave generation and control. In one implementation, the nozzle is configured to cause rapid expansion of the gas emanating therefrom. As an example, the nozzle may have a converging or converging-diverging configuration of appropriate dimensions. In this case, the AP plasma generated within the AP plasma source flows from the nozzle exit at supersonic velocity and at a pressure different from (less than or greater than) the ambient pressure outside the nozzle exit. Another example of a nozzle that may be suitable is a non-axially symmetric nozzle such as an aerospike nozzle. In another implementation, the drive frequency and/or power level applied by the power source to the electrical field generating the plasma are controlled so as to modulate the pressure waves (e.g., compression waves) generated in the AP plasma source. Pressure waves generated in such manner may be, or be similar to, acoustic shock waves or pressure waves. Similarly, this may be accomplished inductively by generating a time-varying magnetic field to modulate the plasma. In another implementation, the geometry of the AP plasma source (e.g., the volume and the length-to-width ratios of the nozzle and/or upstream plasma-generating chamber) may be selected or adjusted so as to selectively filter or enhance certain frequency modes in the pressure waves of the plasma. This may be analogous to causing acoustic gain or resonance to occur to further enhance the coherency of the shock waves. In another implementation, a piezoelectric material, such as for example various known ceramics or polymers (e.g., barium titanate, lead zirconium titanate, polyvinylidene fluoride, etc.) may be driven by the power source to produce vibrations or oscillations transferred to the as-generated plasma plume. In another implementation, the supply gas pressure to the plasma plume may be modulated in order to create the necessary pressure waves or shockwaves by rapidly actuating a high speed gas valve. For example, a pneumatically actuated valve, electrically actuated valve or piezoelectric valve actuator may be used to modulate the pressure being fed into the AP plasma device.

In some implementations, pressure waves or shock waves may be produced by feeding air as a source gas to an AP plasma source of this type at a pressure ranging from 30-110 psi and at a flow rate ranging from 1-7.5 CFM. In another example, the pressure range is 65-95 psi. In another example, the flow rate range is 1-4 CFM. Pressures higher than 110 psi may also be implemented to produce shock waves. In a more general example, the pressure may be 30 psi or greater and the flow rate may be 1 CFM or greater. The AP plasma source may in these cases include a converging or converging-diverging nozzle.

In the various implementations illustrated in FIGS. 2-19, the AP plasma apparatus—whether outputting individual plasma plumes 230 or a single plasma line 1430—provides a substantially uniform or contiguous plasma front that may be focused, together with the blade edge 258, toward a desired coating-substrate interface. In some implementations such as illustrated in FIGS. 2-19, the width of the plasma front may be a substantial portion of the width of the blade 254. By "substantial" is meant that the width of the plasma front in this case ranges from at least greater than half the width of the blade 254 up to equaling the width of the blade 254.

In the various implementations illustrated in FIGS. 2-19, the blade 254 is shown as being a structure distinct from other components disposed in or supported by the main body 216 of the AP plasma source. It will be understood, however, that in any of these implementations the blade 254 may be integrated with the main body 216 to a greater degree. Thus, one or more portions of the body 216 illustrated in FIGS. 2-19 may alternatively be considered as being a portion of the blade 254, depending on where the interface between the body 216 and the blade 254 is defined. As an example, all or part of the plasma-generating units 246 may be embedded within the portion of the main body 216 constituting the blade 254, with the nozzle(s) 222 or other type of plasma outlet(s) being positioned at the blade 254 and at, or at some distance from, the blade edge 258. In this case, the portion of the blade 254 that includes the nozzles 222 or plasma outlets may be oriented such that the plasma plume(s) 230 or plasma line 1430 is angled downward toward the blade edge 258 in a manner similar to that described above as regards the other implementations.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. An atmospheric pressure plasma source, comprising:
    a body including a distal end;
    a blade extending from the distal end and terminating at a blade edge;
    a plasma-generating unit configured for generating a non-thermal, atmospheric pressure plasma; and
    a plasma outlet communicating with the plasma-generating unit and positioned at the distal end, the plasma outlet oriented at a downward angle generally toward the blade edge, wherein the plasma outlet provides a plasma path directed generally toward the blade edge and the plasma is adjacent and proximal to the blade.

2. The atmospheric pressure plasma source of claim 1, wherein the plasma outlet is disposed at a portion of the body above the blade edge.

3. The atmospheric pressure plasma source of claim 1, wherein the plasma outlet is disposed at a portion of the blade above the blade edge.

4. The atmospheric pressure plasma source of claim 1, wherein the blade edge has a blade width transverse to a flow direction of the plasma path, and the plasma outlet is configured to produce a plasma plume along the plasma path having a width coextensive with a substantial portion of the blade width.

5. The atmospheric pressure plasma source of claim 1, wherein the plasma outlet comprises a plurality of nozzles communicating with the respective plasma-generating units.

6. The atmospheric pressure plasma source of claim 1, wherein the plasma outlet comprises a plurality of angled orifices communicating with the respective plasma-generating units and oriented at an angle toward a lateral side of the blade, wherein the angled orifices provide corresponding plasma paths from the plasma-generating units directed generally toward the blade edge and toward the lateral side.

7. The atmospheric pressure plasma source of claim 1, wherein the plasma outlet comprises a contiguous slot-shaped opening communicating with the plasma-generating units.

8. The atmospheric pressure plasma source of claim 1, comprising a gas outlet positioned at the distal end above the plasma outlet and oriented at a downward angle generally toward the blade edge, wherein the gas outlet provides a gas path above the plasma path and directed generally toward the blade edge.

9. The atmospheric pressure plasma source of claim 1, comprising a gas outlet positioned at the distal end below the plasma outlet and above the blade, wherein the gas outlet provides a gas path below the plasma path and directed generally toward the blade edge.

10. The atmospheric pressure plasma source of claim 1, comprising an upper gas outlet positioned at the distal end above the plasma outlet and oriented at a downward angle generally toward the blade edge, and a lower gas outlet positioned at the distal end below the plasma outlet and above the blade, wherein the upper gas outlet and the lower gas outlet provide a gas paths respectively above and below the plasma path and directed generally toward the blade edge.

11. The atmospheric pressure plasma source of claim 1, wherein the body includes a pivotable portion pivotable relative to the blade and the plasma outlet is located at the pivotable portion, and wherein the angle of the plasma path relative to the blade edge is adjustable.

* * * * *